US007512647B2

(12) United States Patent  (10) Patent No.: US 7,512,647 B2
Wilson et al.  (45) Date of Patent: Mar. 31, 2009

(54) CONDENSED GALOIS FIELD COMPUTING SYSTEM

(75) Inventors: James Wilson, Foxboro, MA (US); Yosef Stein, Sharon, MA (US); Joshua Kablotsky, Sharon, MA (US)

(73) Assignee: Analog Devices, Inc., Norwood, MA (US)

( * ) Notice: Subject to any disclaimer, the term of this patent is extended or adjusted under 35 U.S.C. 154(b) by 81 days.

(21) Appl. No.: 10/994,699

(22) Filed: Nov. 22, 2004

(65) Prior Publication Data

US 2006/0123325 A1 Jun. 8, 2006

(51) Int. Cl.
G06F 15/00 (2006.01)
(52) U.S. Cl. ...................................... 708/492
(58) Field of Classification Search .......... 708/491–492
See application file for complete search history.

(56) References Cited

U.S. PATENT DOCUMENTS

| 3,303,477 | A | 2/1967 | Voigt |
| 3,658,864 | A | 4/1972 | Golitz et al. |
| 3,805,037 | A | 4/1974 | Ellison |
| 4,722,050 | A | 1/1988 | Lee et al. |
| 4,847,801 | A | 7/1989 | Tong |
| 4,852,098 | A | 7/1989 | Brechard et al. |
| 4,918,638 | A | 4/1990 | Matsumoto et al. |
| 5,062,057 | A | 10/1991 | Blacken et al. |
| 5,073,864 | A | 12/1991 | Methvin et al. |
| 5,095,525 | A | 3/1992 | Almgren et al. |
| 5,101,338 | A | 3/1992 | Fujiwara et al. |
| 5,182,746 | A | 1/1993 | Hurlbut et al. |
| 5,214,763 | A | 5/1993 | Blaner et al. |
| 5,278,781 | A | * 1/1994 | Aono et al. ............... 708/523 |
| 5,379,243 | A | 1/1995 | Greenberger et al. |
| 5,383,142 | A | 1/1995 | Chung |
| 5,386,523 | A | 1/1995 | Crook et al. |
| 5,446,850 | A | 8/1995 | Jeremiah et al. |
| 5,528,526 | A | 6/1996 | Klug et al. |
| 5,577,262 | A | 11/1996 | Pechanek et al. |
| 5,689,452 | A | 11/1997 | Cameron |
| 5,696,941 | A | 12/1997 | Jung |
| 5,754,563 | A | 5/1998 | White |
| 5,768,168 | A | 6/1998 | Im |
| 5,832,290 | A | 11/1998 | Gostin et al. |
| 5,894,427 | A | 4/1999 | Chung |
| 5,996,057 | A | 11/1999 | Scales, III et al. |
| 5,996,066 | A | 11/1999 | Yung |

(Continued)

OTHER PUBLICATIONS

U.S. Appl. No. 10/665,338, filed Sep. 17, 2003, Stein et al.

(Continued)

*Primary Examiner*—Chuong D Ngo
(74) *Attorney, Agent, or Firm*—Iandiorio Teska & Coleman

(57) ABSTRACT

A condensed Galois field computing system including a multiplier circuit for multiplying first and second polynomials with coefficients over a Galois field to obtain their product; and a Galois field linear transformer circuit for applying an irreducible polynomial of power n to the product including a partial result generator responsive to terms of power n and greater in the product for providing a folded partial result and a Galois field adder for condensing the folded partial result and the terms less than power n in the product to obtain Galois field transformer of power n of the product.

13 Claims, 5 Drawing Sheets

U.S. PATENT DOCUMENTS

| | | | |
|---|---|---|---|
| 5,999,959 | A | 12/1999 | Weng et al. |
| 6,049,815 | A | 4/2000 | Lambert et al. |
| 6,138,208 | A | 10/2000 | Dhong et al. |
| 6,199,086 | B1 | 3/2001 | Dworkin et al. |
| 6,199,087 | B1 | 3/2001 | Blake et al. |
| 6,223,320 | B1 | 4/2001 | Dubey et al. |
| 6,230,179 | B1 | 5/2001 | Dworkin et al. |
| 6,246,768 | B1 | 6/2001 | Kim |
| 6,285,607 | B1 | 9/2001 | Sinclair |
| 6,317,763 | B1 | 11/2001 | Vatinel |
| 6,317,819 | B1 | 11/2001 | Morton |
| 6,349,318 | B1 | 2/2002 | Vanstone et al. |
| 6,384,713 | B1 | 5/2002 | Yu |
| 6,389,088 | B1 | 5/2002 | Blois et al. |
| 6,434,662 | B1 | 8/2002 | Greene et al. |
| 6,480,845 | B1 | 11/2002 | Egolf et al. |
| 6,539,477 | B1 | 3/2003 | Seawright |
| 6,587,864 | B2 | 7/2003 | Stein et al. |
| 6,631,466 | B1 | 10/2003 | Chopra et al. |
| 6,738,794 | B2 | 5/2004 | Stein et al. |
| 6,766,345 | B2 | 7/2004 | Stein et al. |
| 7,133,889 | B2 * | 11/2006 | Parthasarathy et al. ...... 708/492 |
| 2003/0093450 | A1 * | 5/2003 | Chen .................... 708/492 |
| 2003/0110196 | A1 | 6/2003 | Stein et al. |
| 2003/0115234 | A1 | 6/2003 | Stein et al. |
| 2003/0133568 | A1 | 7/2003 | Stein et al. |
| 2003/0135530 | A1 * | 7/2003 | Parthasarathy et al. ...... 708/492 |
| 2003/0140211 | A1 | 7/2003 | Stein et al. |
| 2003/0140212 | A1 | 7/2003 | Stein et al. |
| 2003/0140213 | A1 | 7/2003 | Stein et al. |
| 2003/0149857 | A1 | 8/2003 | Stein et al. |
| 2004/0078409 | A1 | 4/2004 | Stein et al. |
| 2004/0145942 | A1 | 7/2004 | Leijten-Nowak |
| 2004/0210618 | A1 | 10/2004 | Stein et al. |
| 2006/0080376 | A1 * | 4/2006 | Zhang et al. ................. 708/492 |

OTHER PUBLICATIONS

U.S. Appl. No. 10/440,330, filed May 16, 2003, Stein et al.

Ward, R.W. and Molteno, T.C.A., *Efficient Hardware Calculation of Inverses in GF ($2^8$)*, Sep. 2003, University of Otago, Dunedin, New Zealand, Proceedings of ENZCon'03, University of Waikato, New Zealand.

Viktor Fischer, *Realization of the Round 2 AES Candidates Using Altera FPGA*, (Jan. 26, 2001) <http://csrc.nist.gov/CryptoToolkit/aes/roun2/conf3/papers/24-vfischer.pdf> (Micronic—Kosice, Slovakia).

Méire McLoone and J.V. McCanny, *High Performance Single-Chip FPGA Rijndael Algorithm Implementations*, CHES 2001 Proc, LNCS 2162, 65-76 (ç.K. Koç et al. eds. May 16, 2001).

Mekhallalati et al., "Novel Radix Finite Field Multiplier for GF($2^m$)", Journal of VLSI Signal Processing, vol. 15, No. 3, Mar. 1997, pp. 233-244.

Schmit et al., "Address Generation for Memories Containing Multiple Arrays", IEEE Transactions on Computer-Aided Design of Integrated Circuits and Systems, vol. 17, No. 5, May 1998, pp. 377-385.

* cited by examiner

CONDENSED GALOIS FIELD COMPUTING SYSTEM

FIELD OF THE INVENTION

This invention relates to a condensed Galois field computing system.

BACKGROUND OF THE INVENTION

Multiplication of polynomials with coefficients in Galois fields (GF) is widely used in communication systems for Reed Solomon (RS) coding and in advanced encryption. Galois field multiplication is difficult and time consuming for traditional digital signal processors (DSP) to perform: DSP's are optimized for finite impulse response (FIR) filtering and other multiply-accumulate (MAC) intensive operations, but do not efficiently process Galois field types of operations. One approach uses straight forward polynomial multiplication and division over the Galois field using linear feedback shift registers (LFSR's) which process one bit at a time. This is a very slow process. For example, in broadband communication for AES types of applications, where the bit rate is up to 100 megabits per second, there will be up to 12.5 million GF multiplications per second (MPS) and each multiplication may require many e.g. 60-100 operations. Another approach uses look-up tables to perform the Galois field multiplication. Typically, this approach requires 10-20 or more cycles which for 12.5 mps results in a somewhat lower but still very large number of operations e.g. 20×12.5=250 mps or more. Reed-Solomon codes have been widely accepted as the preferred error control coding scheme for broadband networks. A programmable implementation of a Reed-Solomon encoder and decoder is an attractive solution as it offers the system designer the unique flexibility to trade-off the data bandwidth and the error correcting capability that is desired based on the condition of the channel. The first step in Reed-Solomon decoding is the computing of the syndromes. The syndromes can be formally defined as Si=R mod G where i=(0, 1 ... 15). The received code word may be expressed in polynomial form as $R_i = r_o X^{N-1} + r_i X^{N-2} + \ldots r_{N-1}$ where the length of the received word is N. It can be seen that computing the syndrome amounts to polynomial evaluation over the Galois field at the roots as defined by the $j'^{th}$ power of the $i'^{th}$ root of the generator polynomial. For each received word in the Reed-Solomon Algorithm there are sixteen syndromes to be calculated which raise the operations by a factor of sixteen to 400 mps—not practical on current microprocessors. Using the straight forward multiplication instead of the look-up tables raises the operation rate to 1.6 gigs per second. The need for Galois field multiplications is increasing dramatically with the expansion of the communications field and the imposition of encryption requirements on the communication data. This further complicates the matter because each domain error checking encryption needs Galois field multiplication over a different Galois field which requires different sets of look-up tables.

BRIEF SUMMARY OF THE INVENTION

It is therefore an object of this invention to provide an improved condensed Galois field computing system.

It is a further object of this invention to provide such an improved condensed Galois field computing system which requires less power and less area.

It is a further object of this invention to provide such an improved condensed Galois field computing system which is much faster than current look-up tables and linear feedback shift register (LFSR) implementations.

It is a further object of this invention to provide such an improved condensed Galois field computing system which reduces the amount of storage required.

It is a further object of this invention to provide such an improved condensed Galois field computing system which dramatically reduces the number of required operations per second.

The invention results from the realization that an improved condensed Galois field computing system which can operate as a multiplier, multiplier-adder, and multiplier-accumulator requiring less power and area can be achieved by multiplying first and second polynomials with coefficients over a Galois field to obtain their product and then using a Galois field linear transformer circuit to apply an irreducible polynomial of power n to the product including a partial result generator responsive to terms of power n and greater in the product for providing a folded partial result and a Galois field adder for condensing the folded partial result and the terms less than power n in the product to obtain the Galois field transform of power n of the product.

The subject invention, however, in other embodiments, need not achieve all these objectives and the claims hereof should not be limited to structures or methods capable of achieving these objectives.

This invention features condensed Galois field computing system, including a multiplier circuit for multiplying first and second polynomials with coefficients over a Galois field to obtain their product. There is a Galois field linear transformer circuit for applying an irreducible polynomial of power n to the product including a partial result generator responsive to terms of power n in greater in the product for providing a folded partial result. And a Galois field adder for combining the folded partial result and the terms less than power n in a product to obtain the Galois field transformer power n of the product.

In preferred embodiments, the partial result generated may include a look-up table. The look-up table may include the folded partial results for the combinations of n or greater. The look-up table may include an address generator. The address generator may provide statistically independent address access. The Galois field adder may include a three input adder. The third input to the three input adder may be a 0 and the Galois field computing system may operate as a Galois field multiplier. The Galois field in or output may be fed back to the Galois field computing system and the Galois field computing system may operate as a multiplier-accumulator. The Galois field adder output may be fed back to the multiplier circuit with one of the first and second polynomials and the other of the first and second polynomials may constitute the third input to the Galois field adder, so that the Galois field computing system operates as a multiplier-adder. The Galois field adder may include an exclusive OR circuit.

The invention also features a condensed Galois field multiplier system including a multiplier circuit for multiplying first and second polynomials with coefficients over a Galois field to obtain their product, and a Galois field linear transformer circuit for applying an irreducible polynomial of power n to the product including a partial result generator responsive to terms of power n and greater in the product for providing a folded partial result and a Galois field adder for combining the folded partial results and the terms less than power n in the product to perform a Galois field multiply operation.

The invention also features a condensed Galois field multiply-accumulate system including a multiplier circuit for multiplying first and second polynomials with coefficients over a Galois field to obtain their product, and a Galois field linear transformer circuit for applying an irreducible polynomial of power n to the product including a partial result generator responsive to terms of power n and greater in the product for providing a folded partial result and a Galois field adder for combining the folded partial results, the terms less than power n in the product and the Galois field adder fed back to perform a Galois field multiply-accumulate operation.

The invention also features a condensed Galois field multiplier-adder system including a multiplier circuit for multiplying first and second polynomials with coefficients over a Galois field to obtain their product, a Galois field linear transformer circuit for applying an irreducible polynomial of power n to the product including a partial result generator responsive to terms of power n and greater in the product for providing a folded partial result and a Galois field adder whose output is fed back to the multiplier circuit with one of the first and second polynomials and the other of the polynomials is a third input to the Galois field adder along with the folded partial results and the terms less than power n in the product to perform a Galois field multiply-add operation.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
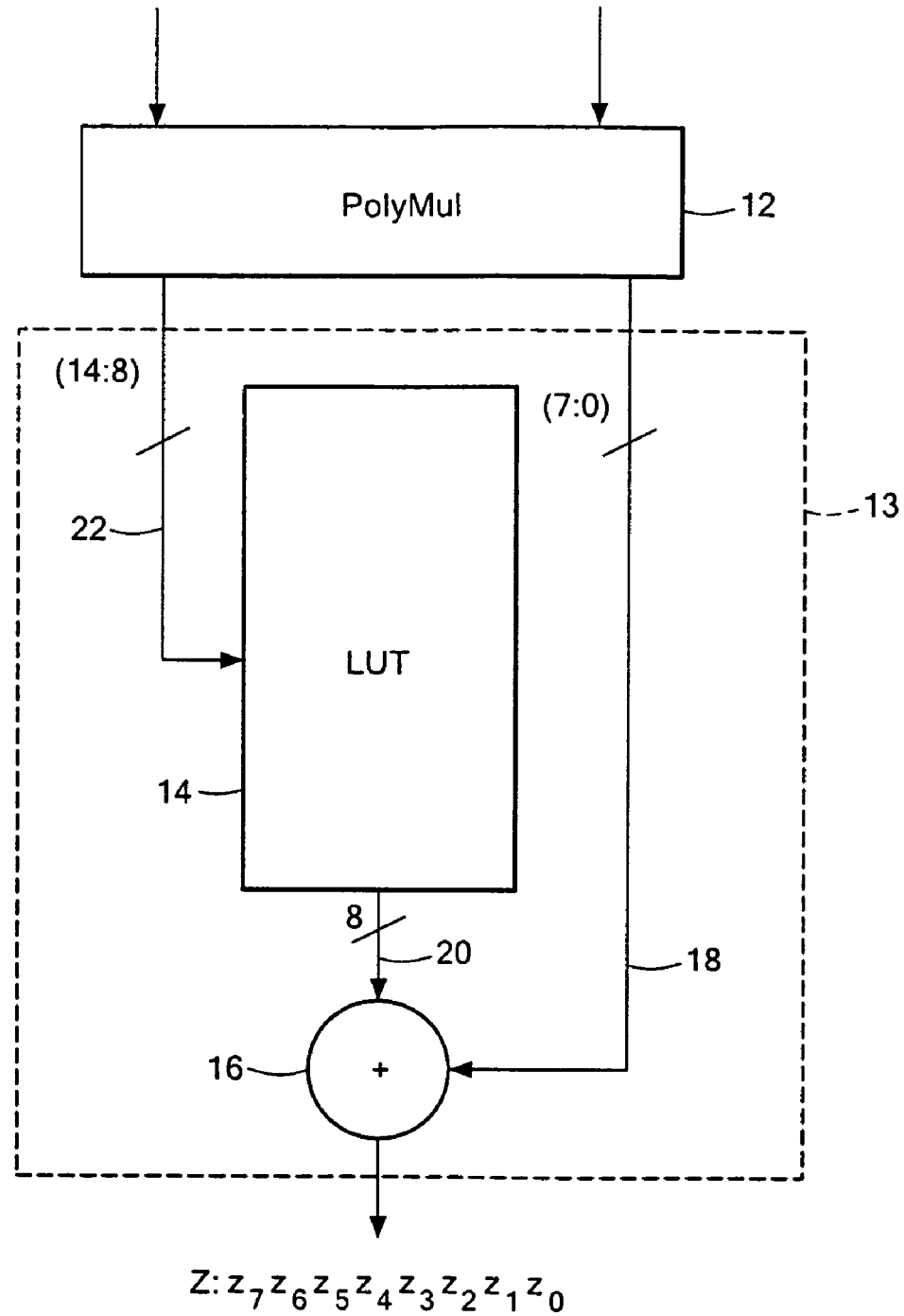
FIG. 1 is a schematic block diagram of a condensed Galois field computing system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a condensed Galois field computing system 10 according to this invention including a polynomial multiplier 12, a Galois field transformer 13 including a look-up table 14, and a Galois field adder such as exclusive OR gate 16 having two inputs 18 and 20.

In operation an 8-bit polynomial with coefficient over $GF(2^8)$ X $(x_7-x_0)$ is multiplied by an 8-bit polynomial Y $(y_7-y_0)$ in polynomial multiplier 12. The polynomial product is a 14-bit number. Instead of dividing this 14-bit product by the field irreducible polynomial of power n to get the modulo reminder as would normally be the procedure, in accordance with this invention, those terms of the polynomial product which are less than the power n of the irreducible polynomial are delivered directly to the Galois Field adder input 18 of exclusive OR gate 16. Those terms in the product which have powers of n or greater are used to access a partial result stored in look-up table 14 which when provided at input 20 to exclusive OR gate 16 and exclusively ORed or Galois field added by exclusive OR gate 16, produce the Galois field transform Z of 8-bits $z_7$-$z_0$. The realization of this invention is that the terms that are below a power n are unaffected by the reduction process (division of the product by an irreducible polynomial where n is the power of that irreducible polynomial), and so they can be delivered directly without any further operation or manipulation to input 18 of Galois field adder 16. Those of the power n or above must go through the reduction process where they are replaced by a folded partial result using a look-up table, which is then added in adder 16 to the lower power terms from input 18 to produce the proper Galois field output. (A partial result look-up table value is generated by expressing all the product terms of power of n or above in terms of power of n−1 or less and accumulating all the terms). For example, if the irreducible polynomial chosen has a power of eight, all those terms in the product from polynomial multiplier 12 which have power seven or below would be delivered directly to input 18 while those that had a power of eight or above would be used on line 22 to access the folded partial result in look-up table 14 which when added to the lower power terms on input 18 produce the proper Galois field output.

Galois field polynomial multiplication can be implemented in two basic steps. The first is a calculation of the polynomial product. $c(x)=a(x)*b(x)$ is algebraically expanded, and like powers are collected (addition corresponds to an X-OR operation between the corresponding terms) to give c(x).

For example $c(x)=(a_7x^7+a_6x^6+a_5x^5+a_4x^4+a_3x^3+a_2x^2+a_1x^1+a_0)*(b_7x^7+b_6x^6+b_5x^5+b_4x^4+b_3x^3+b_2x^3+b_1x^1+b_0)$ $C(x)=c_{14}x^{14}+c_{13}x^{13}+c_{12}x^{12}+c_{11}x^{11}+c_{10}x^{10}+c_9x^9+c_8x^8+c_7x^7+c_6x^6+c_5x^5+c_4x^4+c_3x^3+c_2x^2+c_1x^1+c_0$ where:

CHART I $c14 = a7 * b7$
$c13 = a7 * b6 \oplus a6 * b7$
$c12 = a7 * b5 \oplus a6 * b6 \oplus a5 * b7$
$c11 = a7 * b4 \oplus a6 * b5 \oplus a5 * b6 \oplus a4 * b7$
$c10 = a7 * b3 \oplus a6 * b4 \oplus a5 * b5 \oplus a4 * b6 \oplus a3 * b7$
$c9 = a7 * b2 \oplus a6 * b3 \oplus a5 * b4 \oplus a4 * b5 \oplus a3 * b6 \oplus a2 * b7$
$c8 = a7 * b1 \oplus a6 * b2 \oplus a5 * b3 \oplus a4 * b4 \oplus a3 * b5 \oplus a2 * b6 \oplus a1 * b7$
$c7 = a7 * b0 \oplus a6 * b1 \oplus a5 * b2 \oplus a4 * b3 \oplus a3 * b4 \oplus a2 * b5 \oplus a1 * b6 \oplus a0 * b7$
$c6 = a6 * b0 \oplus a5 * b1 \oplus a4 * b2 \oplus a3 * b3 \oplus a2 * b4 \oplus a1 * b5 \oplus a0 * b6$
$c5 = a5 * b0 \oplus a4 * b1 \oplus a3 * b2 \oplus a2 * b3 \oplus a1 * b4 \oplus a0 * b5$
$c4 = a4 * b0 \oplus a3 * b1 \oplus a2 * b2 \oplus a1 * b3 \oplus a0 * b4$
$c3 = a3 * b0 \oplus a2 * b1 \oplus a1 * b2 \oplus a0 * b3$
$c2 = a2 * b0 \oplus a1 * b1 \oplus a0 * b2$
$c1 = a1 * b0 \oplus a0 * b1$
$c0 = a0 * b0$ The second is the calculation of $d(x)=c(x)$ modulo $p(x)$.

To illustrate, multiplications are performed with the multiplication of polynomials modulo an irreducible polynomial. For example: (if $m(x)=x^8+x^4+x^3+x+1$) $\{57\}*\{83\}=\{c1\}$ because, First Step $$(x^6 + x^4 + x^2 + x + 1) + (x^7 + x + 1) = x^{13} \oplus x^{11} \oplus x^9 \oplus x^8 \oplus x^7$$
$$x^7 \oplus x^5 \oplus x^3 \oplus x^2 \oplus x$$
$$x^6 \oplus x^4 \oplus x^2 \oplus x \oplus x$$
$$= x^{13} \oplus x^{11} \oplus x^9 \oplus x^8 \oplus x^6 \oplus x^5$$
$$\oplus x^4 \oplus x^3 \oplus 1$$

Second Step

For the irreducible polynomial $x^8 + x^4 + x^3 + x + 1$

If the polynomial multiplication product = $x^{13} \oplus x^{11} \oplus x^9 \oplus x^8 \oplus x^6 \oplus x^5 \oplus x^4 \oplus x^3 \oplus 1$ then each of the terms of power n (8) or above are expressed in terms of n−1=7 or less:

$x^8 = x^4 + x^3 + x + 1$ $x^9 = x \cdot x^8 = x(x^4 + x^3 + x + 1) = x^5 + x^4 + x^2 + x$ $x^{11} = x \cdot x^8 = x^3(x^4 + x^3 + x + 1) = x^7 + x^6 + x^4 + x^3$ $x^{13} = x^5 \cdot x^8 = x^5(x^4 + x^3 + x + 1) = x^9 + x^8 + x^6 + x^5$ which simplifies to $x^6 + x^3 + x^2 + 1$ Assigning a 1 to each term to express the terms of power n and above

|  |  | $x^7$ | $x^6$ | $x^5$ | $x^4$ | $x^3$ | $x^2$ | $x^1$ | $x^0$ |
|---|---|---|---|---|---|---|---|---|---|
| Terms of | $x^8$ |  |  |  | 1 | 1 |  | 1 | 1 |
| powder n and | $x^9$ |  |  | 1 | 1 |  | 1 | 1 |  |
| greater in | $x^{11}$ | 1 | 1 |  | 1 | 1 |  |  |  |
| polynomial product | $x^{13}$ |  | 1 |  |  | 1 | 1 |  | 1 |
| Folded Partial Result in LUT 14 |  | 1 | 0 | 1 | 1 | 1 | 0 | 0 | 0 |

By Galois field addition (X-OR 16) of terms of powers less than n in the product with the folded Partial Result for LUT 14 the first Galois field output is obtained.

|  | $x^7$ | $x^6$ | $x^5$ | $x^4$ | $x^3$ | $x^2$ | $x^1$ | $x^0$ |
|---|---|---|---|---|---|---|---|---|
| Product terms of power n−1 less | 0 | 1 | 1 | 1 | 1 | 0 | 0 | 1 |
| $\oplus$ |  |  |  |  |  |  |  |  |
| Folded Partial Result in LUT 14 | 1 | 0 | 1 | 1 | 1 | 0 | 0 | 0 |
| Galois Field adder (X-OR)16 output | 1 | 1 | 0 | 0 | 0 | 0 | 0 | 1 = $x^7 + x^6 + 1$ = 0xc1 |

The irreducible polynomial used in this case: $x^8 + x^4 + x^3 + x + 1$ is only one of many that may be used. For example, any one of those shown in Chart II may be used:

CHART II

:$GF(2^1)$

0x3 (x + 1)

:$GF(2^2)$

0x7 ($x^2$ + x + 1)

:$GF(2^3)$

0xB ($x^3$ + x + 1)
0xD ($x^3$ + $x^2$ + 1)

CHART II-continued

:$GF(2^4)$

0x13 ($x^4$ + x + 1)
0x19 ($x^4$ + $x^3$ + 1)

:$GF(2^5)$

0x25 ($x^5$ + $x^2$ + 1)
0x29 ($x^5$ + $x^3$ + 1)
0x2F ($x^5$ + $x^3$ + $x^2$ + x + 1)
0x37 ($x^5$ + $x^4$ + $x^2$ + x + 1)
0x3B ($x^5$ + $x^4$ + $x^3$ + x + 1)
0x3D ($x^5$ + $x^4$ + $x^3$ + $x^2$ + 1)

:$GF(2^6)$

0x43 ($x^6$ + x + 1)
0x5B ($x^6$ + $x^4$ + $x^3$ + x + 1)
0x61 ($x^6$ + $x^5$ + 1)
0x67 ($x^6$ + $x^5$ + $x^2$ + x + 1)
0x6D ($x^6$ + $x^5$ + $x^3$ + $x^2$ + 1)
0x73 ($x^6$ + $x^5$ + $x^4$ + x + 1)

:$GF(2^7)$

0x83 ($x^7$ + x + 1)
0x89 ($x^7$ + $x^3$ + 1)
0x8F ($x^7$ + $x^3$ + $x^2$ + x + 1)
0x91 ($x^7$ + $x^4$ + 1)
0x9D ($x^7$ + $x^4$ + $x^3$ + $x^2$ + 1)
0xA7 ($x^7$ + $x^5$ + $x^2$ + x + 1)
0xAB ($x^7$ + $x^5$ + $x^3$ + x + 1)
0xB9 ($x^7$ + $x^5$ + $x^4$ + $x^3$ + 1)
0xBF ($x^7$ + $x^5$ + $x^4$ + $x^3$ + $x^2$ + x + 1)
0xC1 ($x^7$ + $x^6$ + 1)
0xCB ($x^7$ + $x^6$ + $x^3$ + x + 1)
0xD3 ($x^7$ + $x^6$ + $x^4$ + x + 1)
0xE5 ($x^7$ + $x^6$ + $x^5$ + $x^2$ + 1)
0xF1 ($x^7$ + $x^6$ + $x^5$ + $x^4$ + 1)
0xF7 ($x^7$ + $x^6$ + $x^5$ + $x^4$ + $x^2$ + x + 1)
0xFD ($x^7$ + $x^6$ + $x^5$ + $x^4$ + $x^3$ + $x^2$ + 1)

:$GF(2^8)$

0x11D ($x^8$ + $x^4$ + $x^3$ + $x^2$ + 1)
0x12B ($x^8$ + $x^5$ + $x^3$ + x + 1)
0x12D ($x^8$ + $x^5$ + $x^3$ + $x^2$ + 1)
0x14D ($x^8$ + $x^6$ + $x^3$ + $x^2$ + 1)
0x15F ($x^8$ + $x^6$ + $x^4$ + $x^3$ + $x^2$ + x + 1)

CHART II-continued

0x163 ($x^8$ + $x^6$ + $x^5$ + x + 1)
0x165 ($x^8$ + $x^6$ + $x^5$ + $x^2$ + 1)
0x169 ($x^8$ + $x^6$ + $x^5$ + $x^3$ + 1)
0x171 ($x^8$ + $x^6$ + $x^5$ + $x^4$ + 1)
0x187 ($x^8$ + $x^7$ + $x^2$ + x + 1)
0x18D ($x^8$ + $x^7$ + $x^3$ + $x^2$ + 1)
0x1A9 ($x^8$ + $x^7$ + $x^5$ + $x^3$ + 1)
0x1C3 ($x^8$ + $x^7$ + $x^6$ + x + 1)
0x1CF ($x^8$ + $x^7$ + $x^5$ + $x^3$ + $x^2$ + x + 1)
0x1E7 ($x^8$ + $x^7$ + $x^6$ + $x^5$ + $x^2$ + x + 1)
0x1F5 ($x^8$ + $x^7$ + $x^5$ + $x^4$ + $x^2$ + 1)

Figure 2:
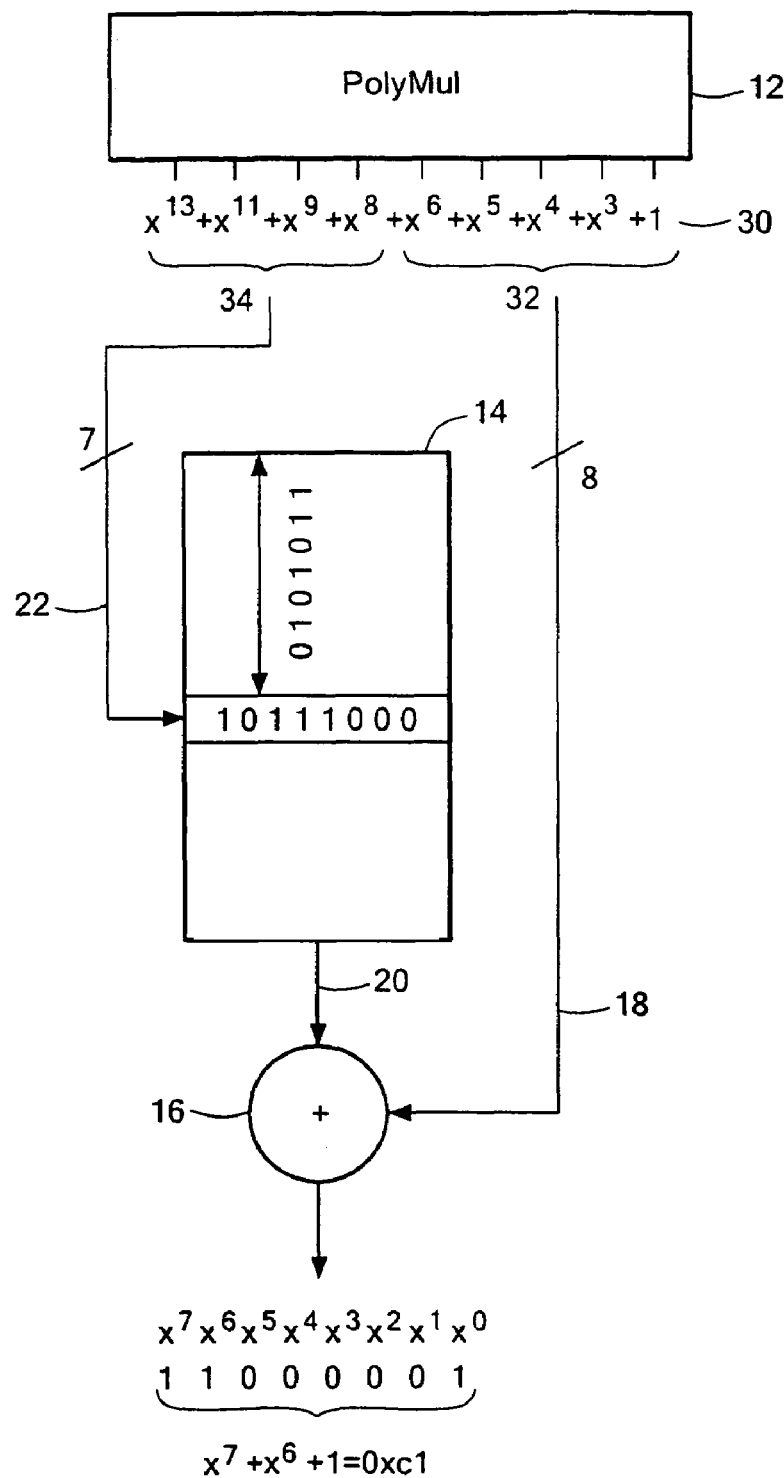
FIG. 2 is a schematic block diagram of the folded partial results look-up table of FIG. 1.
Figure 3:
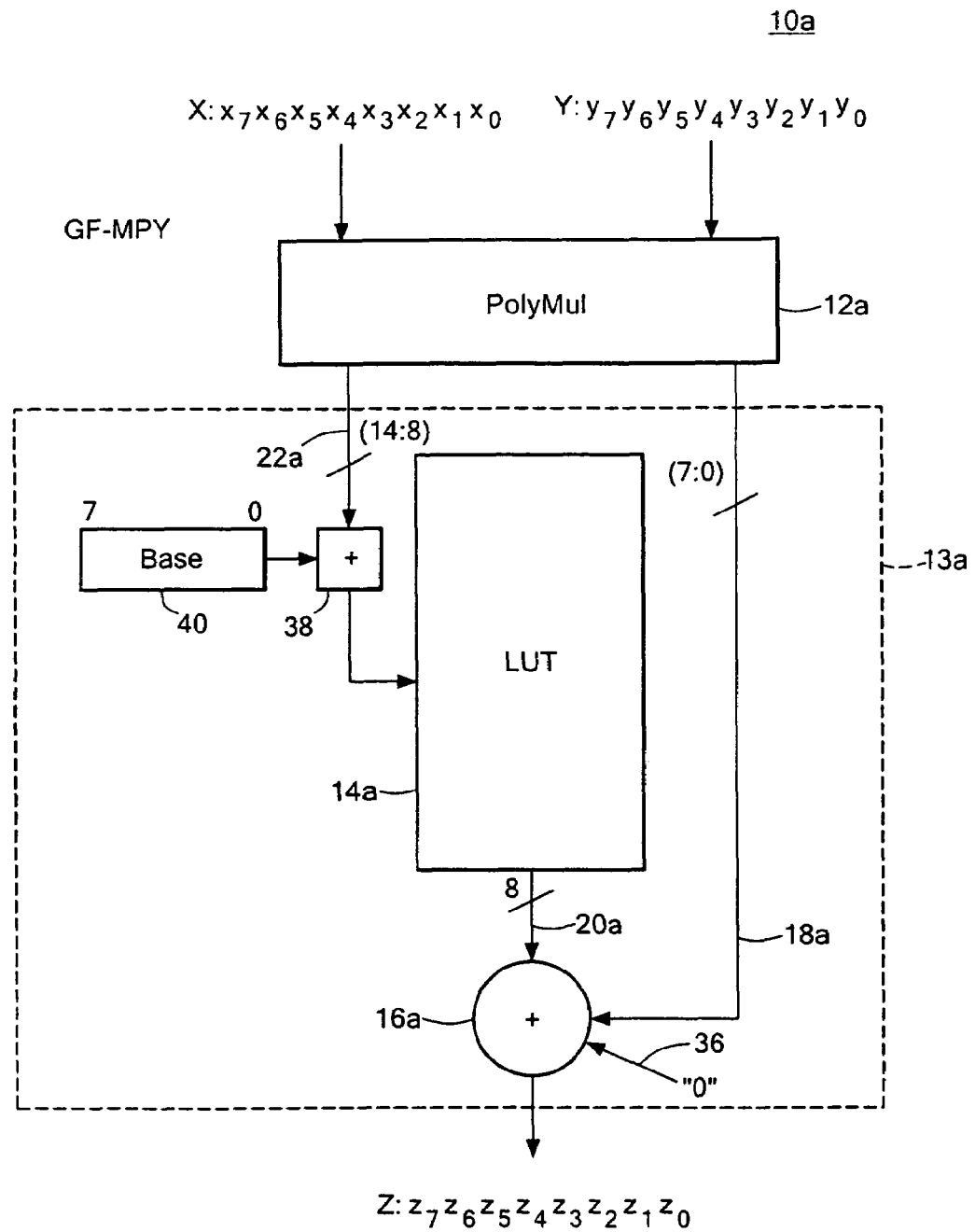
FIG. 3 is a schematic block diagram similar to FIG. 1 with the Galois adder having a third input set for operation as a Galois field multiplier.

In summary, applying the irreducible polynomial 0x11b ($x^8 + x^4 + x^3 + x + 1$) having a power n=8 to the polynomial product 30, FIG. 2, from the polynomial multiplier 12, that product can be viewed in two sections 32 and 34. Section 32 contains all of those terms of powers less than n, where n=8 and section 34 represents all of those terms in polynomial product 30 which have powers of 8 or greater. Since the irreducible polynomial that we chose to deal with has a power n=8, there will be 128 possible combinations or folded partial results that are stored in look-up table 14. Each one is addressed by a different combination of terms which make up the n or greater section 34. More information on Galois field transformers and multipliers may be found in U.S. Pat. No. 6,587,864 B2 issued Jul. 1, 2003, Stein et al., entitled, GALOIS FIELD LINEAR TRANSFORMER, U.S. Pat. No. 6,766,345 B2 issued Jul. 20, 2004, Stein et al. entitled, GALOIS FIELD MULTIPLIER SYSTEM, and U.S. Pat. No. 7,177,891 B2 issued Feb. 13, 2007, Stein et al., entitled COMPACT GALOIS FIELD MULTIPLIER ENGINE, each of which is herein incorporated in its entirety by this reference.

Figure 4:
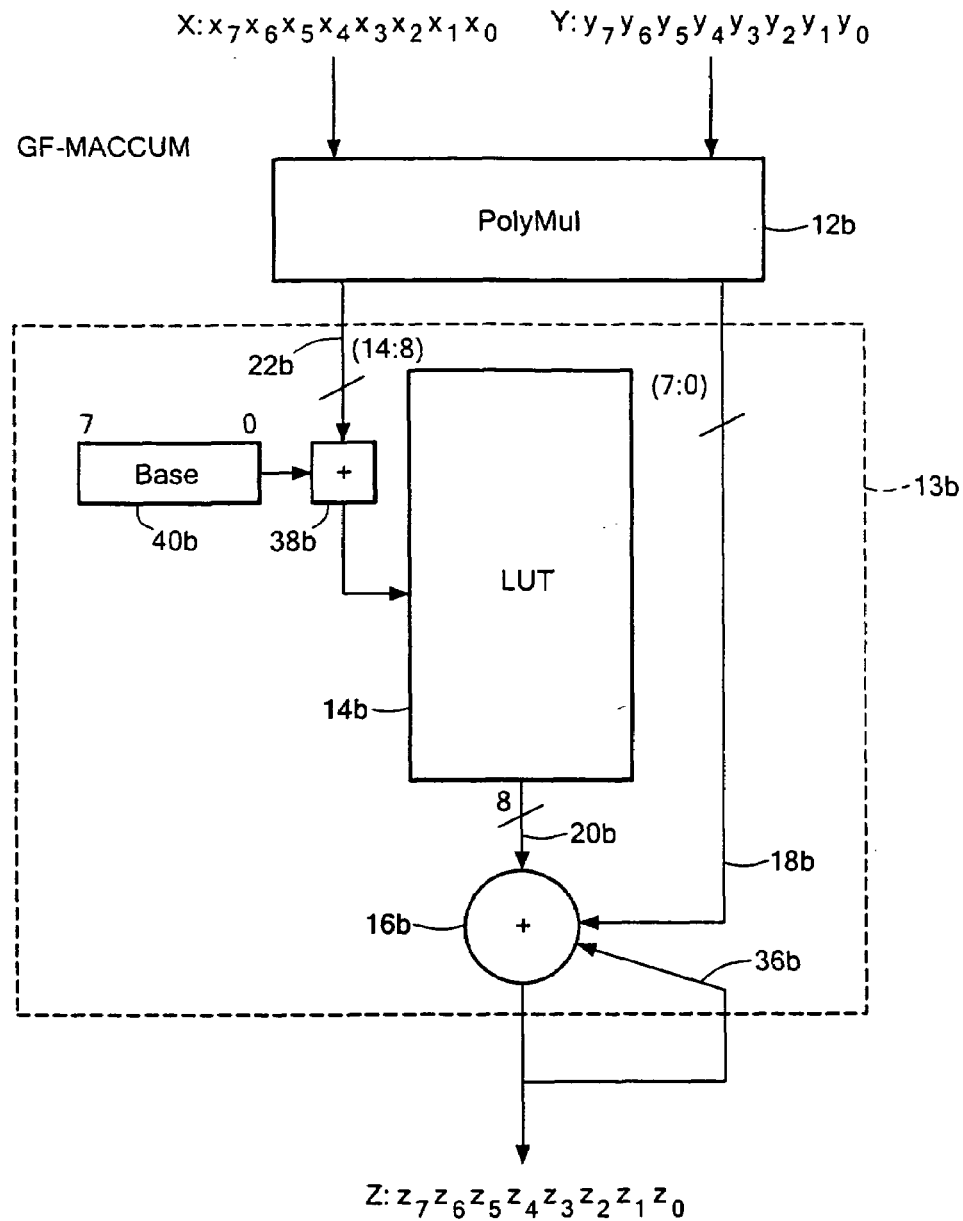
FIG. 4 is a schematic block diagram similar to FIG. 1 with the Galois adder having a third input connected for operation as a Galois field multiplier-accumulator.

Condensed Galois field computing system 10a, according to this invention, may be more generalized using a Galois field adder, exclusive OR gate 16a, that includes three inputs the third input 36 may be a 0 when Galois field computing system 10a is operated as a multiplier. There may also be provided an address generator including adder circuit 38 and base address circuits 40. Then, for example, for advanced encryption standards (AES) look-up table 14a may have a base of 0 added to the addresses coming in on line 22a so that the addresses will be from 0 to 127, and for a Reed-Solomon operation base 40 may add the number 128 to the address coming in on 22a to access addresses from 128 to 255. In that way the different irreducible polynomial based Galois Field multipliers can coexist in the same system. Based on the fact that the base address is a multiple of $2^7$ (the last 7 Lsb's are guaranteed to be "zero") and the address generator adder 38 can be simplified to be a simple OR-circuit. The condensed Galois field computing system according to this invention, 10b, FIG. 4, can be operated as a multiplier-accumulator by applying the output from Galois field adder, exclusive OR gate 16b, back to OR gate 16b.

Figure 5:
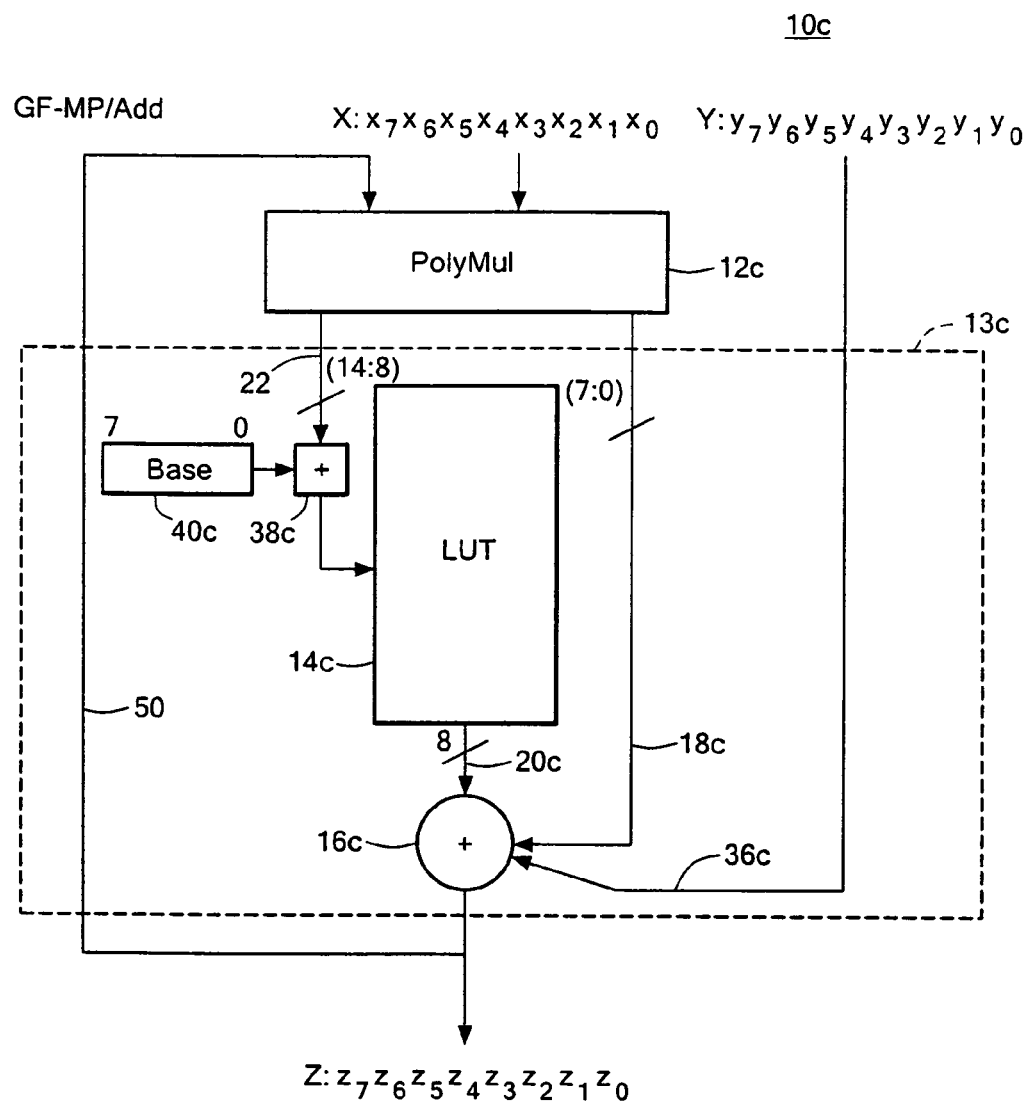
FIG. 5 is a schematic block diagram similar to FIG. 1 with the Galois adder having a third input connected for operation as a Galois field multiplier-adder.

And it may be operated as multiplier-adder 10c, FIG. 5, by applying one of the polynomials X to polynomial multiplier 12c while the other one Y is applied to input 36c of Galois field adder, exclusive OR gate 16c. The output of Galois field adder 16c is fed back over line 50 to the other input of polynomial multiplier 12c. Further discussion of Galois field multiply-add and other Galois field operations are discussed in U.S. Pat. No. 7,082,452 B2 issued Jul. 25, 2006, Stein et al. entitled GALOIS FIELD MULTIPLY/MULTIPLY-ADD/MULTIPLY ACCUMULATE, and U.S. patent application Ser. No. 10/440,330 filed May 16, 2003, Stein et al. entitled COMPOUND GALOIS FIELD ENGINE AND GALOIS FIELD DIVIDER AND SQUARE ROOT ENGINE AND METHOD, each of which is herein incorporated in its entirety by this reference.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A condensed Galois field computing system comprising:
   a multiplier circuit for multiplying first and second polynomials with coefficients over a Galois field to obtain their product; and
   a Galois field transformer circuit for applying an irreducible polynomial of power n to said product including a partial result generator responsive to terms of power n and greater in said product for providing a folded partial result and a Galois field adder for combining said folded partial result and the terms less than power n in the product to obtain Galois field transform of power n of said product, said partial result generator including a look-up table that includes the folded partial results for the terms with the power of n or greater, the computing system used for error correction and/or encryption.

2. The condensed Galois field computing system of claim 1 in which said look-up table includes an address generator for said selecting one of the folded partial results tables.

3. The condensed Galois field computing system of claim 2 in which said address generator provides statically independent address access.

4. The condensed Galois field computing system of claim 2 in which said address generator includes an OR circuit for combining said terms of n and greater and said value of base address to generate the look-up table address.

5. The condensed Galois field computing system of claim 1 in which said Galois field adder includes a three input adder.

6. The condensed Galois field computing system of claim 5 in which said third input to said three input adder is a zero and said Galois field computing system operates as a Galois field multiplier.

7. The condensed Galois field computing system of claim 5 in which said third input to said three input adder is the Galois field adder output fed back and said Galois field computing system operates as a multiplier-accumulator.

8. The condensed Galois field computing system of claim 5 in which the Galois field adder output is fed back to said multiplier circuit with one of said first and second polynomials and the other of said polynomials is the third input to said Galois field adder and said Galois field computing system operates as a multiplier-adder.

9. The condensed Galois field computing system of claim 1 in which the Galois field adder includes an exclusive OR circuit.

10. The condensed Galois field computing system of claim 1 in which said look-up table includes at least one folded partial results table.

11. A condensed Galois field multiplier system comprising:
   a multiplier circuit for multiplying first and second polynomials with coefficients over a Galois field to obtain their product; and
   a Galois field transformer circuit for applying an irreducible polynomial of power n to said product including a partial result generator responsive to terms of power n and greater in said product for providing a folded partial result and a Galois field adder for combining said folded partial results and the terms less than power n in the product to perform a Galois field multiply operation, said partial result generator including a look-up table that includes the folded partial results for the terms with the power of n or greater, the multiplier system used for error correction and/or encryption.

12. A condensed Galois field multiply-accumulate system comprising:

a multiplier circuit for multiplying first and second polynomials with coefficients over a Galois field to obtain their product; and a Galois field transformer circuit for applying an irreducible polynomial of power n to said product including a partial result generator responsive to terms of power n and greater in said product for providing a folded partial result and a Galois field adder for combining said folded partial results, the terms less than power n in the product and the output of the Galois field adder fed back to perform a Galois field multiply-accumulate operation, said partial result generator including a look-up table that includes the folded partial results for the terms with the power of n or greater, the multiply-accumulate system used for error correction and/or encryption.

13. A condensed Galois field multiplier-adder system comprising:

a multiplier circuit for multiplying first and second polynomials with coefficients over a Galois field to obtain their product; and a Galois field transformer circuit for applying an irreducible polynomial of power n to said product including a partial result generator responsive to terms of power n and greater in said product for providing a folded partial result and a Galois field adder whose output is fed back to said multiplier circuit with one of said first and second polynomials and the other of said polynomials is a third input to said Galois field adder along with said folded partial results and the terms less than power n in the product to perform a Galois field multiply-add operation, said partial result generator including a look-up table that includes the folded partial results for the terms with the power of n or greater, the multiplier-adder system used for error correction and/or encryption.

* * * * *